United States Patent
Moon et al.

(10) Patent No.: US 9,407,275 B1
(45) Date of Patent: Aug. 2, 2016

(54) APPARATUS FOR LOCK DETECTION SUITABLE FOR FRACTIONAL-N FREQUENCY SYNTHESIZER AND METHOD THEREOF

(71) Applicant: FCI Inc., Seognam-si, Gyeonggi-do (KR)

(72) Inventors: Je Cheol Moon, Seongnam-si (KR); Myung Woon Hwang, Seongnam-si (KR)

(73) Assignee: FCI, Inc. (KR)

( * ) Notice: Subject to any disclaimer, the term of this patent is extended or adjusted under 35 U.S.C. 154(b) by 0 days.

(21) Appl. No.: 14/714,400

(22) Filed: May 18, 2015

(30) Foreign Application Priority Data

Jan. 21, 2015 (KR) .......................... 10-2015-0009967

(51) Int. Cl.
*H03L 7/06* (2006.01)
*H03L 7/095* (2006.01)
*H03L 7/197* (2006.01)

(52) U.S. Cl.
CPC .............. *H03L 7/095* (2013.01); *H03L 7/1972* (2013.01); *H03L 7/1974* (2013.01)

(58) Field of Classification Search
CPC ..................................................... H03L 7/095
See application file for complete search history.

(56) References Cited

U.S. PATENT DOCUMENTS

2003/0007585 A1* 1/2003 Dalton ................... H03L 7/087
375/376

FOREIGN PATENT DOCUMENTS

KR   20010005039 A   1/2001
KR   20060010032 A   2/2006

* cited by examiner

*Primary Examiner* — Daniel Puentes
(74) *Attorney, Agent, or Firm* — Roger D. Emerson; Emerson Thomson Bennett, LLC

(57) ABSTRACT

Disclosed are an apparatus for lock detection suitable for a fractional-N frequency synthesizer and a method thereof. The lock detector for use in the fractional-N frequency synthesizer includes a delay unit delaying an N-divider output frequency clock based on an output value of a fraction ratio modulator, a lock detection unit outputting a lock detection signal by comparing a reference frequency clock with the N-divider output frequency clock delayed by the delay unit, a counter counting the number of lock detection signals received from the lock detection unit, and a controller issuing a command to output a lock identification signal based on the number of lock detection signals counted by the counter.

12 Claims, 7 Drawing Sheets

APPARATUS FOR LOCK DETECTION SUITABLE FOR FRACTIONAL-N FREQUENCY SYNTHESIZER AND METHOD THEREOF

BACKGROUND

1. Technical Field

The present invention relates to an apparatus for lock detection used in a frequency synthesizer and a method thereof, and more particularly, to an apparatus for lock detection suitable for a fractional-N frequency synthesizer and method thereof.

2. Description of the Related Art

The following descriptions do not constitute the related art and only provide background information related to embodiments of the present invention.

A frequency synthesizer generates and sends signals at a desired frequency within a predetermined range. A frequency synthesizer is generally designed using a phase locked loop (hereinafter referred to as PLL).

Such a PLL-based frequency synthesizer divides an output frequency by N (N being a positive integer) and outputs a desired frequency by comparing the divided frequency with a reference frequency less vulnerable to surrounding environments such as temperature.

PLL-based frequency synthesizers are classified into integer-N frequency synthesizers and fractional-N frequency synthesizers according to whether N is fixed.

In the integer-N frequency synthesizer, N, i.e. an output frequency division factor, has a fixed value and thus a division ratio is an integer. On the contrary, in the Fractional-N frequency synthesizer, N changes into two or more values adjacent to N and thus frequency division is performed several times to achieve interpolation such that a division ratio becomes a real number.

At low frequencies, a desired output frequency can be obtained even when the integer-N frequency synthesizer is used. However, at high frequencies, since the integer-N frequency synthesizer has difficulty in fine adjustment of an output frequency, it is difficult to obtain a desired output frequency.

A noise level of a frequency synthesizer can be represented by 20 log N[dB]. Since a reference frequency $F_{ref}$ and an output frequency $F_{VCO}$ satisfy a relationship of '$F_{VCO}=F \times N$', fine adjustment of the output frequency is possible even when the reference frequency is reduced. However, in this case, a value of N needs to be increased, and thus lots of noise occur based on the formula 20 log N[dB]. When a division ratio is a real number instead of an integer, fine adjustment of the output frequency is possible without reduction of the reference frequency, which is the primary benefit of the fractional-N frequency synthesizer. In addition, the fractional-N frequency synthesizer allows widened output frequency bandwidth and narrow channel spacing, thereby satisfying various communication standards.

The expression "frequency synthesizer is locked" means that a divided output frequency and a reference frequency are identical to each other and only have difference in phase. An output frequency derived from the frequency synthesizer is not applicable to various electronics, such as communication apparatuses or multimedia, until the frequency synthesizer is locked. Thus, the frequency synthesizer is provided with a lock detector configured to determine whether a current output frequency is locked.

Some examples of typical lock detectors are disclosed in KR Patent Publication No. 2001-0005039 A, KR Patent Publication No. 2006-0010032 A, and the like. Although these lock detectors are suitable for use in an integer-N frequency synthesizer with a fixed N value, there is a problem of inaccuracy in lock detection when used in a fractional-N frequency synthesizer with a variable N value.

Embodiments of the present invention provide a method and apparatus for lock detection used in a fractional-N frequency synthesizer, which can inform that an output frequency is locked to a desired frequency due to normal operation of a PLL in a rapid and accurate manner.

BRIEF SUMMARY

Embodiments of the present invention provide a method and apparatus for lock detection which can perform lock detection in a relatively rapid and accurate manner when used in a fractional-N frequency synthesizer, as compared with a typical method and apparatus for lock detection.

In accordance with one aspect of the present invention, a lock detector for use in a fractional-N frequency synthesizer includes: a delay unit delaying an N-divider output frequency clock based on an output value of a fraction ratio modulator; a lock detection unit outputting a lock detection signal by comparing a reference frequency clock with the N-divider output frequency clock delayed by the delay unit; a counter counting the number of lock detection signals received from the lock detection unit; and a controller issuing a command to output a lock identification signal based on the number of lock detection signals counted by the counter.

In accordance with another aspect of the present invention, a method for lock detection used in a fractional-N frequency synthesizer includes: delaying an N-divider output frequency clock based on an output value of a fractional modulator; counting the number of lock detection signals outputted by comparing a reference frequency clock with the delayed N-divider output frequency clock; and outputting a lock identification signal when the number of lock detections reaches a preset count value or more.

According to the embodiments of the present invention, the method and apparatus for lock detection can detect lock of an output frequency to a desired frequency in a rapid and accurate manner when used in a fractional-N frequency synthesizer, thereby improving performance of the frequency synthesizer.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Figure 1:
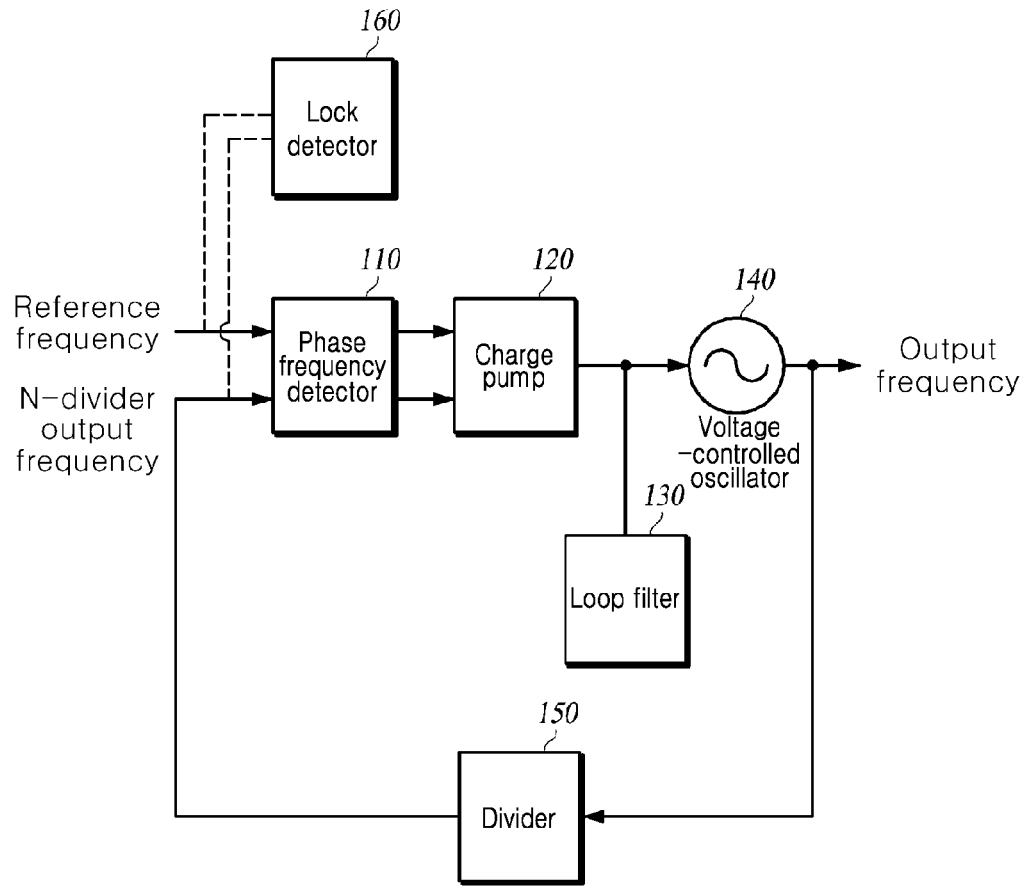
FIG. 1 is a block diagram of an integer-N frequency synthesizer.

Hereinafter, embodiments of the present invention will be described with reference to the accompanying drawings. It should be noted that like components will be denoted by like reference numerals throughout the specification and the accompanying drawings. In addition, descriptions of details apparent to those skilled in the art will be omitted for clarity.

It will be understood that, although the terms "first", "second", "i)", "ii)", "a)", b)", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. In addition, it will be understood that the terms "includes", "comprises", "including" and/or "comprising," when used in this specification, specify the presence of stated features, steps, operations, elements, and/or components, but do not preclude the presence or addition of one or more other features, steps, operations, elements, components, and/or groups. Further, as used herein, the term "unit", "module", etc. means a unit component for processing at least one function or operation, and may be realized by "hardware", "software", or "a combination of hardware and software".

FIG. 1 is a block diagram of an integer-N frequency synthesizer.

The integer-N frequency synthesizer includes a temperature compensated crystal oscillator (TCXO) (not shown), a phase frequency detector (PFD) 110, a charge pump (CP) 120, a loop filter (LF) 130, a voltage-controlled oscillator (VCO) 140, a divider 150, and a lock detector 160.

The crystal oscillator (not shown) is an accurate and stable frequency source less vulnerable to change in the surrounding environment such as change in ambient temperature, and generates a reference frequency.

The divider 150 receives a feedback output frequency and divides the output frequency by a predetermined division ratio. Since the reference frequency generated by the crystal oscillator (not shown) is typically a low frequency, the output frequency must be N-divided to compare with the reference frequency. When the output frequency is fed back to the divider 150, the divider 150 outputs an N-divided frequency, which is referred to as an N-divider output frequency. In the integer-N frequency synthesizer, the N-divider 150 has a fixed division ratio.

The phase frequency detector 110 compares the N-divider output frequency with the reference frequency and outputs a pulse sequence corresponding to a difference therebetween. The charge pump 120 supplies or discharges an output proportional to a pulse width derived from the phase frequency detector 110. The loop filter 130 removes high frequency components from the output of the charge pump 120 and supplies the output to the voltage-controlled oscillator 140. The voltage-controlled oscillator 140 outputs a frequency proportional to an input voltage.

The lock detector 160 receives inputs of the reference frequency and the N-divider output frequency and determines whether the integer-N frequency synthesizer is locked.

Figure 2:
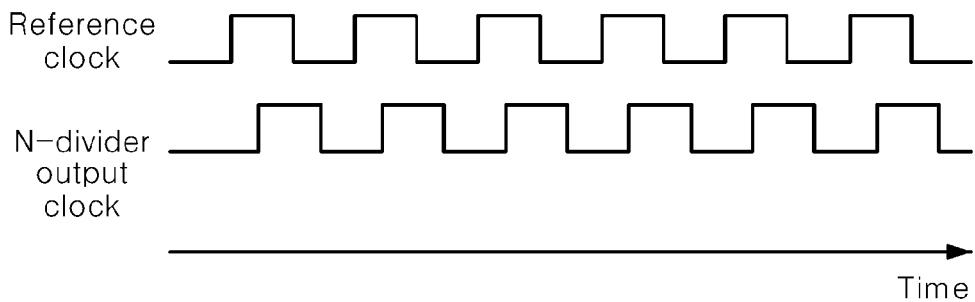
FIG. 2 shows an output waveform on a time axis when a typical lock detector is used in the integer-N frequency synthesizer.

FIG. 2 shows an output waveform on a time axis when a typical lock detector is used in the integer-N frequency synthesizer.

Referring to FIG. 2, a typical lock detector compares an N-divider output frequency clock delayed for a predetermined period of time with a reference frequency clock to determine whether an output frequency is locked. Specifically, after the reference frequency clock is delayed for a predetermined period of time, and the N-divider output frequency clock is a little more delayed than the reference frequency clock, the lock detector outputs a lock identification signal when a difference in phase between two signals remains constant during a predetermined cycle of the reference frequency.

Figure 3:
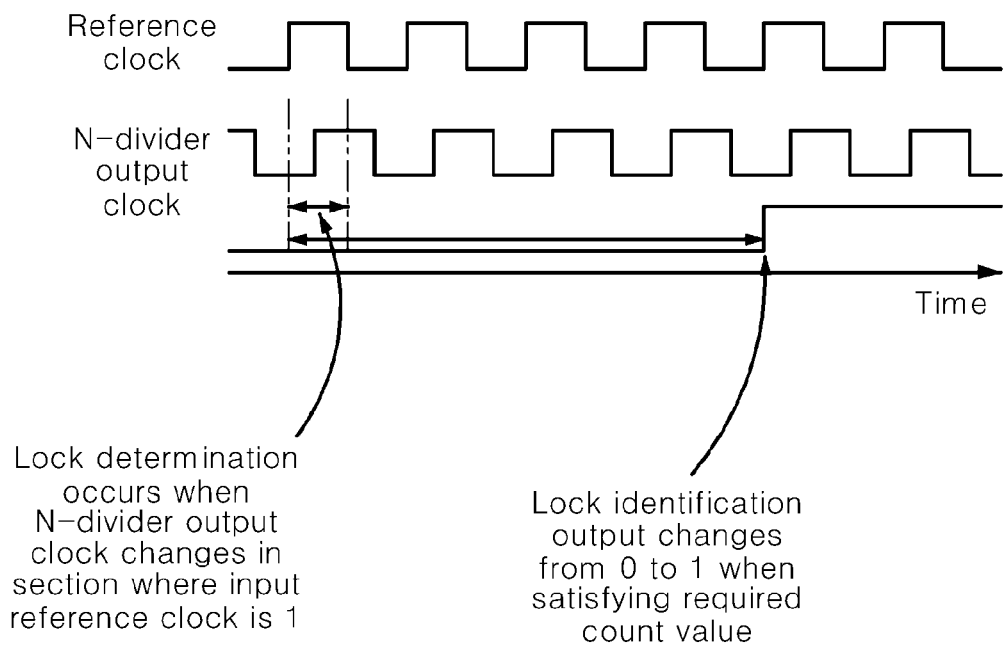
FIG. 3 shows time points of lock identification signal outputs on a time axis when a typical lock detector is used in the integer-N frequency synthesizer.

FIG. 3 shows time points of a lock identification signal output on a time axis when a typical lock detector is used in the integer-N frequency synthesizer.

The lock detector generates lock detection signals using a flip-flop circuit and the like upon receiving a rising edge of the N-divider output frequency clock with the reference frequency clock being 1.

As shown in FIG. 3, when the number of lock detection signals reaches a preset count value or more within a predetermined period of time, the lock detector determines that the frequency synthesizer is locked and outputs a lock identification signal. By way of example, FIG. 3 shows a lock detector that outputs a lock identification signal when lock detection signals are output four times within a predetermined period of time.

However, when the typical lock detector is used in a fractional-N frequency synthesizer, it is difficult to detect an accurate lock point.

Figure 4:
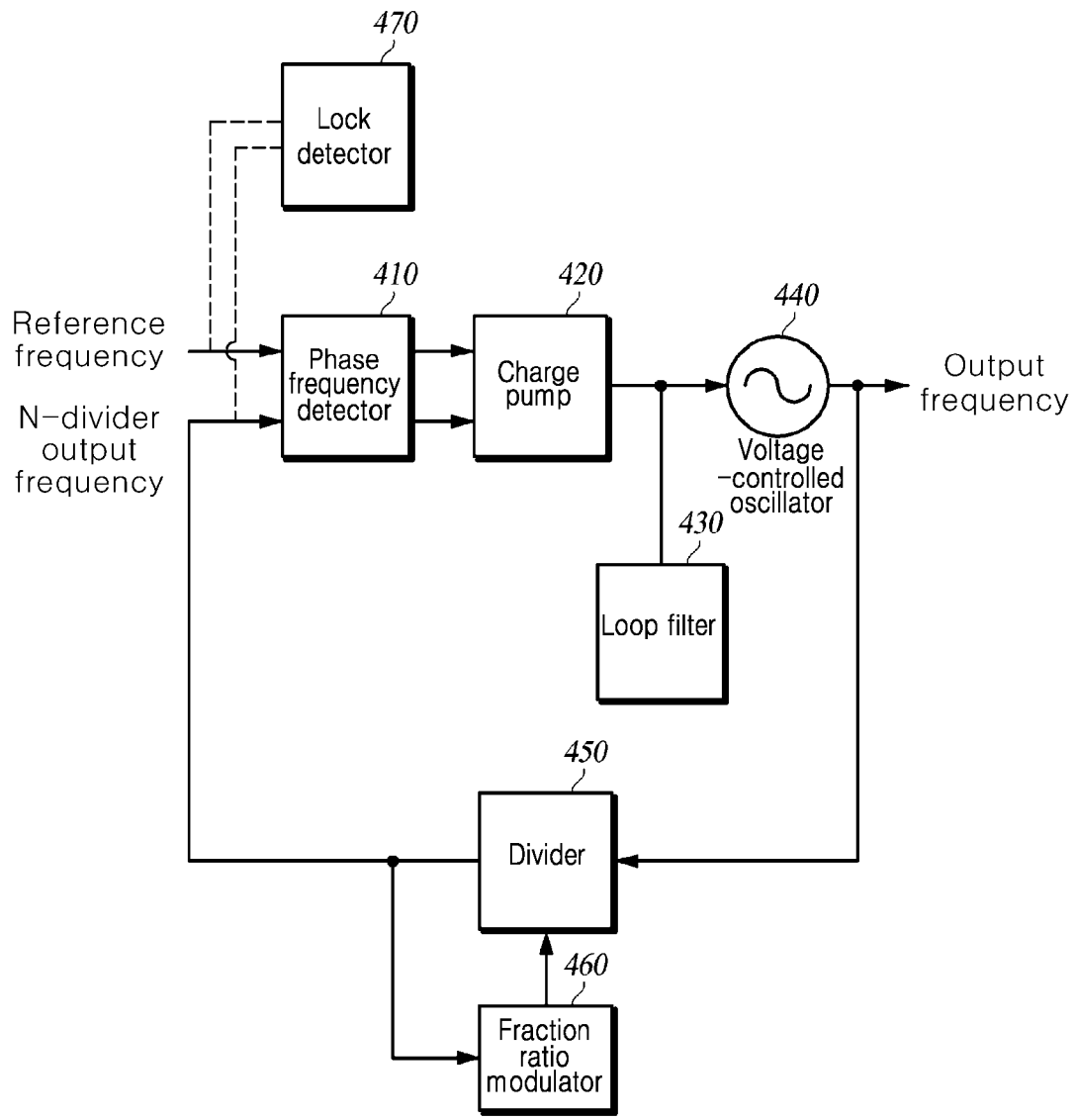
FIG. 4 is a block diagram of a fractional-N frequency synthesizer.

FIG. 4 is a block diagram of a fractional-N frequency synthesizer.

The fractional-N frequency synthesizer includes a temperature compensated crystal oscillator (TCXO) (not shown), a phase frequency detector (PFD) 410, a charge pump (CP) 420, a loop filter (LF) 430, a voltage-controlled oscillator (VCO) 440, and a divider 450. A lock detector 470 receives inputs of the reference frequency and the N-divider output frequency and determines whether the fractional-N frequency synthesizer is locked.

The fractional-N frequency synthesizer further includes a fractional ratio modulator 460 in addition to the components of the integer-N frequency synthesizer. The fractional ratio modulator 460 dynamically changes a division ratio of the divider 450, thereby implementing a precise division ratio below the decimal point.

The crystal oscillator (not shown) is an accurate and stable frequency source less vulnerable to change in the surrounding environment such as change in ambient temperature, and configured to produce a reference frequency.

The divider 450 receives a feedback output frequency and divides the output frequency by a predetermined division ratio. Since the reference frequency generated by the crystal oscillator (not shown) is typically a low frequency, the output frequency must be N-divided for comparison with the reference frequency. When the output frequency is fed back to the divider 450, the divider 450 outputs an N-divided frequency. In the fractional-N frequency synthesizer, it is possible to dynamically change the division ratio of the divider by an input from the fractional ratio modulator 460 such that the division ratio becomes an approximate real number.

The divider 450 can only divide the output frequency by an integer ratio. For example, when N=2000, the divider 450 outputs a frequency obtained by dividing the output frequency by 2000. When trying to divide the output frequency by a real number, as needed, the fractional ratio modulator 460 is used.

For example, when trying to output a frequency obtained by the output frequency by 2000.125, the fractional ratio modulator 460 selects an integer adjacent to N given that N=2000, thereby producing a division ratio approaching 2000.125.

When trying to produce a division ratio of 2000.125 at 16 ($2^4$) cycles, division by a division ratio of 2000 is performed fourteen times and division by a division ratio of 2001 is performed two times, whereby the resulting division ratio becomes approximately 2000.125 since (2000×14+2001×2)/16=2000.125.

The fractional ratio modulator 460 allows the output frequency to be divided by division ratios adjacent to N, thereby producing a real number division ratio. The fractional ratio modulator 460 variably outputs a value m (m being an integer) required for producing desired real number division ratio, and the divider 450 divides the output frequency by a division ratio of N+m. Here, N is a fixed value, and m is a value variable by the fractional ratio modulator 460.

The fractional ratio modulator 460 may be a $\Sigma\Delta$ Modulator.

The $\Sigma\Delta$ Modulator performs oversampling much faster than the Nyquist rate to transfer quantization noise to a high frequency band much higher than a signal band. As a result, in the $\Sigma\Delta$ Modulator, a signal transfer function has a size of 1, whereas a transfer function for noise resulting from quantization has characteristics of a high pass filter.

When the $\Sigma\Delta$ modulator is used in the fractional-N frequency synthesizer, the overall noise of the frequency synthesizer can be reduced due to noise characteristics of the $\Sigma\Delta$ modulator, thereby minimizing signal transfer error. Thus, in the fractional-N frequency synthesizer, the $\Sigma\Delta$ modulator is mainly used as the fractional ratio modulator 460.

The phase frequency detector 410 compares the N-divider output frequency with the reference frequency and to output a pulse sequence corresponding to the difference therebetween. The charge pump 420 supplies or discharges an output proportional to a pulse width derived from the phase frequency detector 410.

The loop filter 430 removes high frequency components from the output of the charge pump 420 and supplies the output to the voltage-controlled oscillator 440. The voltage-controlled oscillator 440 outputs a frequency proportional to an input voltage.

The lock detector 470 receives inputs of the reference frequency and the N-divider output frequency and determines whether the fractional-N frequency synthesizer is locked.

Figure 5:
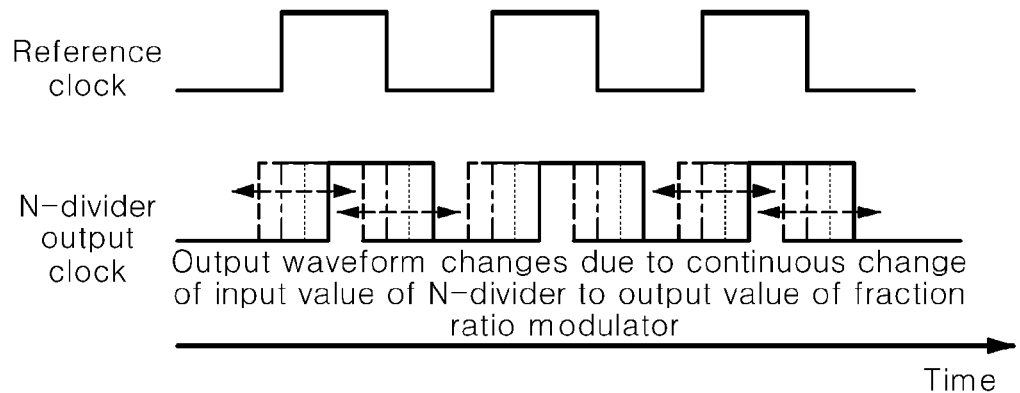
FIG. 5 shows an output waveform on a time axis when a typical lock detector is used in the fractional-N frequency synthesizer.

FIG. 5 shows an output waveform on a time axis when a typical lock detector is used in the fractional-N frequency synthesizer.

Referring to FIG. 5, in the fractional-N frequency synthesizer, the N-divider output frequency clock continuously changes according to an output value m of the fractional ratio modulator 460.

Figure 6:
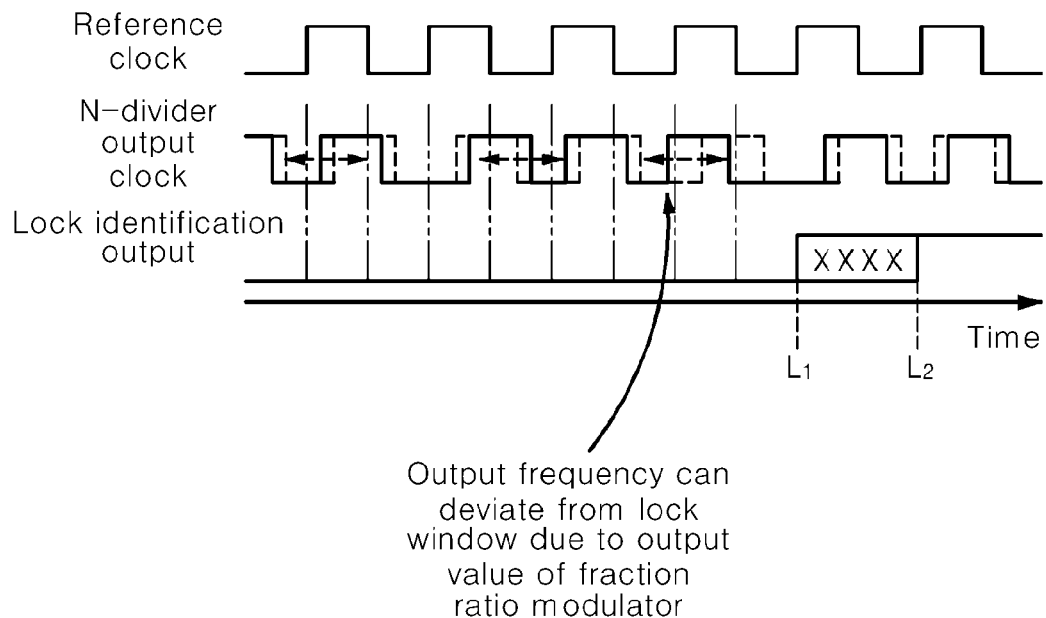
FIG. 6 shows time points of lock identification signal outputs on a time axis when a typical lock detector is used in the fractional-N frequency synthesizer.

FIG. 6 shows time points of lock identification signal outputs on a time axis when a typical lock detector is used in the fractional-N frequency synthesizer.

The lock detector generates lock detection signals using a flip-flop circuit and the like upon receiving a rising edge of the N-divider output frequency clock with the reference frequency clock being 1.

When the number of lock detection signals reaches a preset count value or more within a predetermined period of time, the lock detector determines that the frequency synthesizer is locked and outputs a lock identification signal. By way of example, FIG. 6 shows a lock detector which outputs a lock identification signal when lock detection signals are output four times within a predetermined period of time.

Since, unlike an integer-N frequency synthesizer with a fixed division ratio, the fractional-N frequency synthesizer has an unfixed division ratio, when the typical lock detector is used in the fractional-N frequency synthesizer, it is difficult to detect an accurate lock point.

As described above, in the fractional-N frequency synthesizer, the N-divider output frequency clock continuously changes according to the output value of the fractional ratio modulator 460. Thus, when the typical lock detector is used, the N-divider output frequency clock can deviate from a lock window of the reference frequency clock even in a locked state, which causes failure in output of the lock detection signal.

In the lock detector shown in FIG. 6, although a lock identification signal is normally output at an $L_1$ point after lock detection signals are output four times, since the N-divider output frequency clock deviates from the lock window of the reference frequency clock due to the output value of the fractional ratio modulator 460, the lock identification signal is output at an $L_2$ point.

The lock detector according to the present invention shifts the N-divider output frequency clock using the output value of the fractional ratio modulator 460 so as to catch an accurate lock point in the fractional-N frequency synthesizer.

Figure 7:
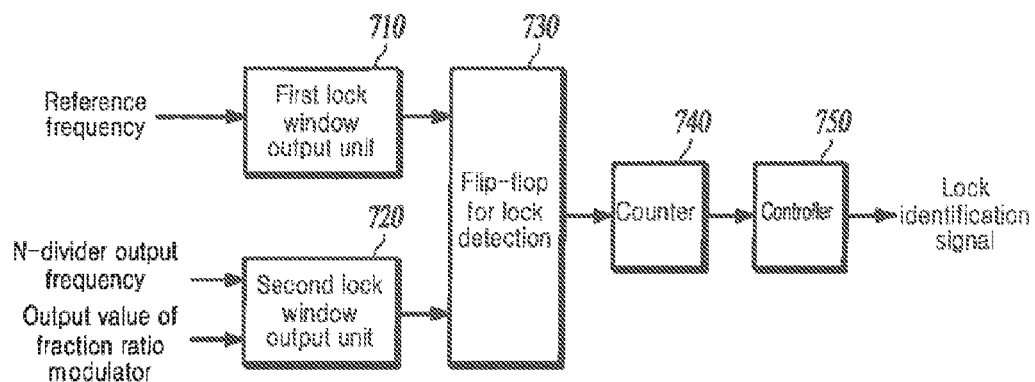
FIGS. 7 and 8 are block diagrams of a lock detector according to the present invention.
Figure 8:
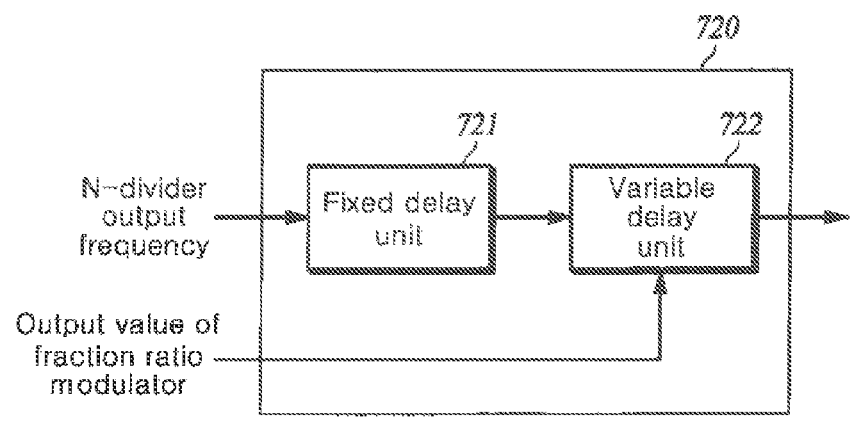

FIGS. 7 and 8 are block diagrams of the lock detector according to the present invention.

Referring to FIG. 7, the lock detector according to the invention includes a first lock window output unit 710, a second lock window output unit 720, a lock detection unit 730, a counter 740, and a controller 750.

Referring to FIG. 8, the second lock window output unit 720 includes a fixed delay unit 721 and a variable delay unit 722.

The first lock window output unit 710 outputs a reference frequency clock as a lock window. When the first lock window output unit 710 outputs the reference frequency clock as a lock window, the lock window output may be delayed for $T_1$ ($T_1$ being a constant).

The second lock window output unit 720 outputs an N-divider output frequency clock as a lock window. When the second lock window output unit 710 outputs the N-divider output frequency clock as a lock window, the lock window output may be delayed for a predetermined period of time.

The second lock window output unit 720 includes a fixed delay unit 721 and a variable delay unit 722.

The fixed delay unit 721 delays the N-divider output frequency clock for $T_2$ ($T_2$ being a constant). It is possible to easily detect an incoming rising edge of the N-divider output frequency clock with the reference frequency clock being 1 using a flip-flop circuit and the like through proper adjustment of the fixed delay time $T_1$ of the reference frequency clock and the fixed delay time $T_2$ of the N-divider output frequency clock.

The variable delay unit 722 delays the N-divider output frequency clock for (D−m)×k (D and k being constants, and m being an output value of the fractional ratio modulator). The variable delay unit 722 delays the N-divider output frequency clock in a variable manner according to the output value of the fractional ratio modulator 460, thereby preventing lock detection failure of the fractional-N frequency synthesizer caused by deviation of the N-divider output frequency clock from the lock window of the reference frequency clock despite lock of the N-divider output frequency.

The lock detector 730 generates lock detection signals using a flip-flop circuit and the like upon receiving a rising edge of the N-divider output frequency clock with the reference frequency clock being 1.

The counter 740 counts the number of lock detection signals received from the lock detector 730.

The controller 750 issues a command to output a lock identification signal when the number of lock detection signals counted by the counter 740 reaches a preset count value or more within a predetermined period of time.

The lock detector according to the present invention will be described in more detail with reference to an output waveform upon use of the lock detector.

Figure 9:
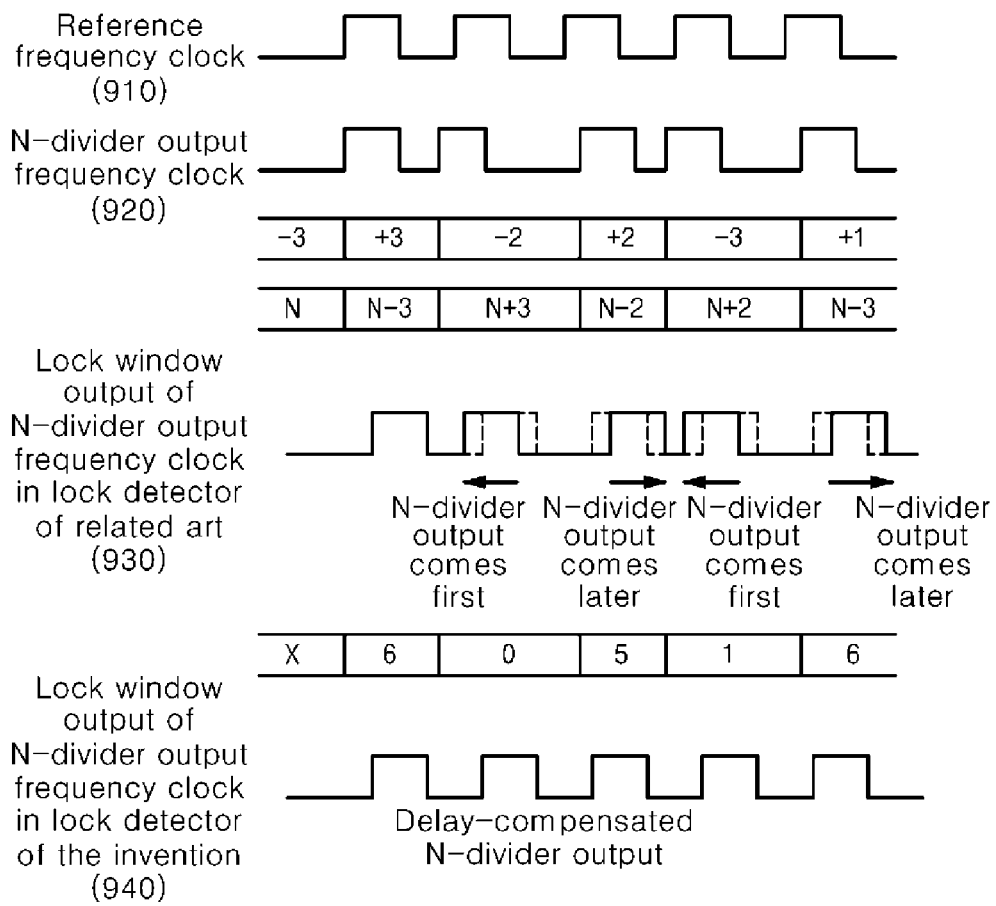
FIG. 9 shows an output waveform on a time axis when the lock detector according to the present invention is used in the fractional-N frequency synthesizer.

FIG. 9 shows an output waveform on a time axis when the lock detector according to the present invention is used in the fractional-N frequency synthesizer.

In FIG. 9, −3, +3, −2, +2, −3, and +1 represent output values of the fractional ratio modulator 460.

In FIG. 9, N, N−3, N+3, N−2, N+2, and N−3 represent that the division ratio of the divider 450 changes dynamically according to the output values of the fractional ratio modulator 460.

As shown in FIG. 9, when a typical lock detector is used in the fractional-N frequency synthesizer, since a lock window output 930 of the N-divider output frequency clock changes dynamically according to the output value of the fractional ratio modulator 460, the N-divider output frequency clock can deviate from the lock window of the reference frequency clock, thereby causing lock detection failure.

In the lock detector according to the present invention, the variable delay unit 722 can vary a delay time according to the output value of the fractional ratio modulator 460 to correct change in output point of the lock window of the N-divider output frequency clock, thereby allowing detection of an accurate lock point.

Specifically, the variable delay unit 722 delays the N-divider output frequency clock for (D−m)×k (D and k being constants, and m being an output value of the fractional ratio modulator). For example, when D is 3 and the output value m of the fractional ratio modulator 460 is −3, +3, −2, +2, −3 and +1, the delay time by the variable delay unit 722 is 6, 0, 5, 1, 6 and 2, respectively. FIG. 9 shows a time amount by which an output point of the lock window of the N-divider output frequency clock is delayed by the variable delay unit 722.

When the lock detector according to the present invention is used in the fractional-N frequency synthesizer, since the output 940 of the lock widow of the N-divider output frequency is dynamically delayed according to the output value of the fractional ratio modulator 460, it is possible to prevent lock detection failure due to deviation of the N-divider output frequency clock from the lock window of the reference frequency clock despite lock of the N-divider output frequency.

Figure 10:
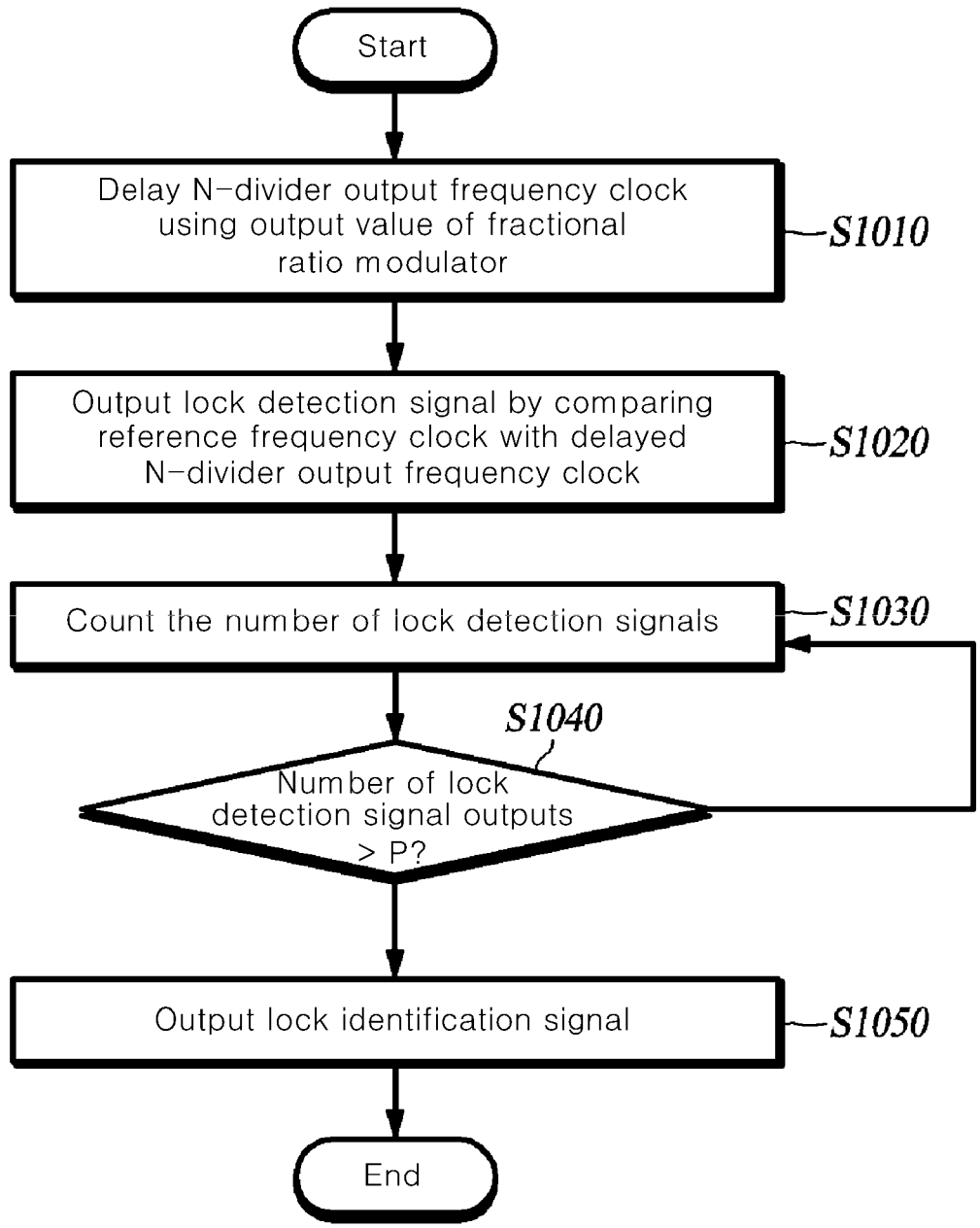
FIG. 10 is a flowchart showing a method for lock detection according to the present invention.

FIG. 10 is a flowchart showing a method for lock detection according to the present invention.

The method for lock detection according to the present invention includes: a delay step (S1010); a lock detection signal output step (S1020), a lock detection signal counting step (S1030), a lock determination step (S1040), and a lock identification signal output step (S1050).

In the delay step (S1010), output of a lock window of an N-divider output frequency clock is delayed based on an output value of the fractional ratio modulator 460. Specifically, the N-divider output frequency clock is delayed for a fixed amount T, and the N-divider output frequency clock is variably delayed by (D−m)×k (D and k being constants, and m being an output value of the fractional ratio modulator).

In the lock detection signal output step (S1020), a lock detection signal is output by comparing a reference frequency clock with the N-divider output frequency clock delayed in the delay step (S1010). Specifically, the lock detection signal is generated using a flip-flop circuit and the like upon entry of a rising edge of the N-divider output frequency clock with the reference frequency clock being 1.

In the lock detection signal counting step (S1030), the number of lock detection signals generated in the lock detection signal output step (S1020) are counted.

In the lock determination step (S1040), whether the number of lock detection signals counted in the lock detection signal counting step (S1030) reaches a preset count value P or more is determined.

When the number of lock detection signals reaches the preset count value P or more, the process proceeds to the lock identification signal output step (S1050) to output a lock identification signal.

The process of variably delaying the N-divider output frequency clock based on the output value of the fractional ratio modulator to generate an accurate lock detection signal is the same as described above.

Although some embodiments have been described herein, it should be understood that these embodiments are provided for illustration only and are not to be construed in any way as limiting the present invention, and that various modifications, changes, alterations, and equivalent embodiments can be made by those skilled in the art without departing from the spirit and scope of the invention. The scope of the present invention should be defined by the appended claims and equivalents thereof.

LIST OF REFERENCE NUMERALS

110: Phase frequency detector
120: Charge pump
130: Loop filter
140: Voltage-controlled oscillator
150: Divider
160: Lock detector
410: Phase frequency detector
420: Charge pump
430: Loop filter
440: Voltage-controlled oscillator
450: Divider
460: Fractional ratio modulator
470: Lock detector
710: First lock window output unit
720: Second lock window output unit
721: Fixed delay unit
722: Variable delay unit
730: Lock detector
740: Counter
750: Controller

What is claimed is:

1. A lock detector for use in a fractional-N frequency synthesizer, comprising:
a delay unit delaying an N-divider output frequency clock based on an output value of a fractional ratio modulator;
a lock detection unit outputting a lock detection signal by comparing a reference frequency clock with the N-divider output frequency clock delayed by the delay unit;
a counter counting the number of lock detection signals received from the lock detection unit; and a controller issuing a command to output a lock identification signal based on the number of lock detection signals counted by the counter.

2. The lock detector according to claim 1, wherein the fractional ratio modulator is a ΣΔ Modulator.

3. The lock detector according to claim 1, wherein the delay unit dynamically imparts a variable delay to the N-divider output frequency clock according to the output value of the fractional ratio modulator.

4. The lock detector according to claim 1, wherein the variable delay is (D−m)×k (D and k being constants, m being an output value of the fractional ratio modulator).

5. The lock detector according to claim 1, wherein the lock detection unit outputs the lock detection signal upon receiving a rising edge of the N-divider output frequency clock delayed by the delay unit in a section where the reference frequency clock is 1.

6. The lock detector according to claim 1, wherein the controller issues a command to output the lock identification signal when the number of lock detection signals reaches a preset count value or more within a half cycle of the reference frequency.

7. A method of lock detection used in a fractional-N frequency synthesizer, comprising:
   delaying an N-divider output frequency clock based on an output value of a fractional ratio modulator;
   outputting a lock detection signal by comparing a reference frequency clock with the delayed N-divider output frequency clock;
   counting the number of lock detection signals outputted; and
   outputting a lock identification signal when the number of lock detection signals counted reaches a preset count value or more.

8. The method according to claim 7, wherein the fractional ratio modulator is a ΣΔ Modulator.

9. The method according to claim 7, wherein the delaying an N-divider output frequency clock comprises dynamically imparting a variable delay to the N-divider output frequency clock according to the output value of the fractional ratio modulator.

10. The method according to claim 7, wherein the variable delay is a multiple of D−m (D being a constant and m being an output value of the fractional ratio modulator).

11. The method according to claim 7, wherein the counting the number of lock detection signals comprises counting the number of lock detection signals upon receiving a rising edge of the delayed N-divider output frequency clock in a section where the reference frequency clock is 1.

12. The method according to claim 7, wherein the outputting a lock identification signal comprises issuing a command to output the lock identification signal when the number of lock detection signals reaches the preset count value or more within a half cycle of the reference frequency.

* * * * *